United States Patent [19]

Higgins, III et al.

[11] Patent Number: 5,583,370
[45] Date of Patent: Dec. 10, 1996

[54] TAB SEMICONDUCTOR DEVICE HAVING DIE EDGE PROTECTION AND METHOD FOR MAKING THE SAME

[75] Inventors: Leo M. Higgins, III; John C. Gentile, both of Austin, Tex.

[73] Assignee: Motorola Inc., Schaumburg, Ill.

[21] Appl. No.: 514,442

[22] Filed: Aug. 11, 1995

Related U.S. Application Data

[63] Continuation of Ser. No. 205,429, Mar. 4, 1994, abandoned.
[51] Int. Cl.⁶ ........................... H01L 23/495; H01L 23/06
[52] U.S. Cl. ........................... 257/667; 257/684; 257/687; 257/787
[58] Field of Search .................................. 257/667, 684, 257/787, 687, 702

[56] References Cited

U.S. PATENT DOCUMENTS

| | | | |
|---|---|---|---|
| 4,143,456 | 3/1979 | Inoue | 257/787 |
| 4,330,790 | 5/1982 | Burns | 357/70 |
| 4,711,688 | 12/1987 | Pienimaa | 156/244 |
| 4,839,713 | 6/1989 | Teraoka et al. | 257/787 |
| 4,907,061 | 3/1990 | Kohara | 257/787 |
| 5,073,817 | 12/1991 | Ueda | 257/787 |

*Primary Examiner*—Sara W. Crane
*Assistant Examiner*—David Ostrowski

[57] ABSTRACT

A semiconductor device (42) has a protective containment housing (44) around the edges (24) of the die (12) to protect the die. A plurality of leads (30) are TAB bonded to the die's active surface (18). The containment housing is attached around the die such that a portion of the inner sidewalls of the housing contacts the edges of the die to seal the edges. The top edge of the containment housing acts as a dam to prevent encapsulant (14') overflowing down the die edges and to the die's inactive surface (28). Various embodiments of the containment housing are possible.

11 Claims, 3 Drawing Sheets

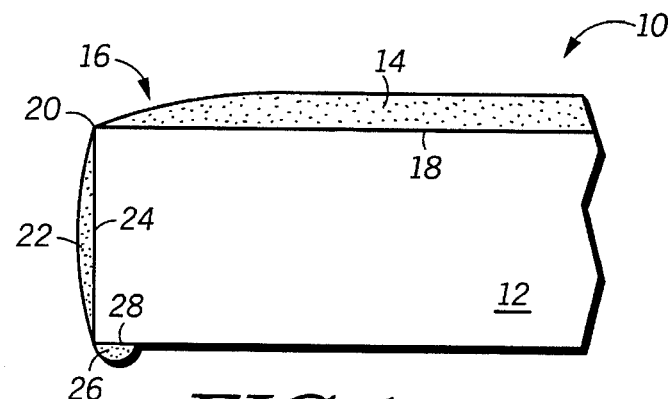
FIG. 1
−PRIOR ART−
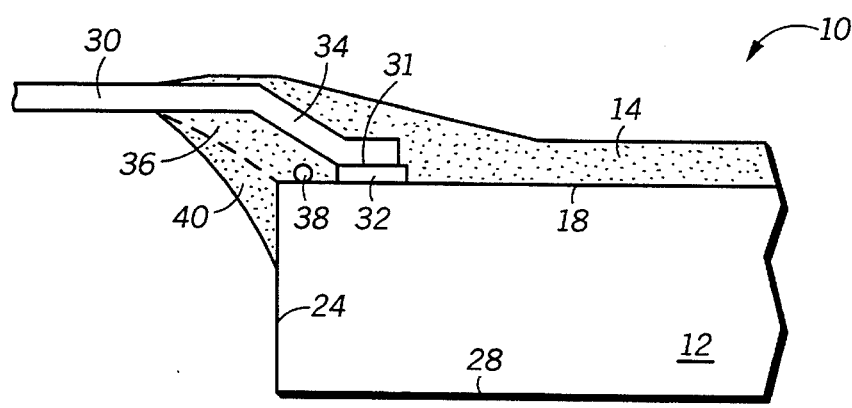
FIG. 2
−PRIOR ART−
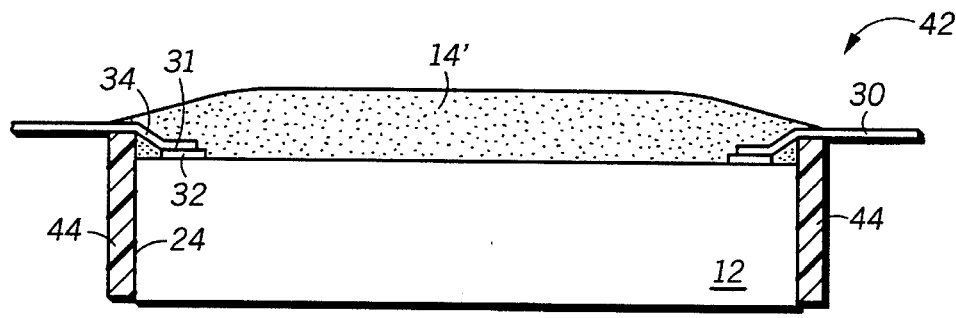
FIG. 3
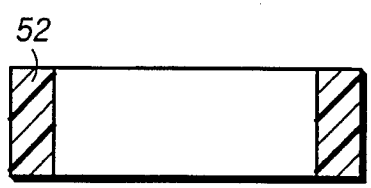 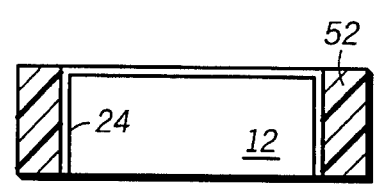 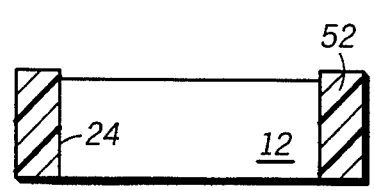
FIG. 4   FIG. 5   FIG. 6

TAB SEMICONDUCTOR DEVICE HAVING DIE EDGE PROTECTION AND METHOD FOR MAKING THE SAME

This application is a continuation of prior application Ser. No. 08/205,429, filed Mar. 4, 1994, now abandoned.

FIELD OF THE INVENTION

The present invention relates generally to a semiconductor device, and more specifically to a tape automated bonding (TAB) semiconductor device having die edge protection and a method for making the same.

BACKGROUND OF THE INVENTION

Tape automated bonding (TAB) is a common methodology used for the interconnection of integrated circuits or semiconductor devices. This method of interconnection employs a pattern of conductors which is typically carried upon and supported by a flexible, insulative, polymeric substrate film. This pattern of conductors is typically formed from chemically etched copper foil, and the substrate is typically a polyimide, polyester, or glass fiber reinforced film. The tips of the pattern of conductors, also called lead tips, are bonded to bonding pads on the active surface of a semiconductor die using either a bump bonding or a bumpless bonding process. This process is generically called inner-lead-bonding.

After bonding, the active surface of the semiconductor die is usually coated with a protective polymeric covering to prevent mechanical damage to the semiconductor die, to reduce soft errors caused by incident ionizing radiation, and to provide environmental protection from corrosive environments in which the semiconductor device may be used. The polymeric material is usually an epoxy or silicone which can be dispensed in either a glob top or a die coat process, which will be generically referred to as an encapsulation process.

In the glob top process, the polymeric glob top material is often solvent-free and quite viscous, and the resulting coating tends to be quite thick. Although overall die coverage is good, the material flow underneath the leads can be poor which typically results in voids underneath the leads. When a glob top material is used, the large volume of material and the coefficient of thermal expansion mismatch between the silicon semiconductor die and the glob top material can result in the cracking of a large semiconductor die. Thus, glob top is not the preferred process for TAB encapsulation.

Typical die coat material contains a solvent and has a lower viscosity than glob top material. Due to its lower viscosity, the die coat material flows well underneath the leads and around the inner lead bonds to cover the active semiconductor die surface. However, because of the dispensing process and the fluid nature of the die coat material, a convex or concave meniscus is formed at the outer surface of the coating, depending upon the quantity of the material dispensed on the die. Furthermore, a slight "pull back" occurs when the die coat material is cured, which results in an incomplete coverage of the device. Additionally, a thin coating of material results at the edges of the semiconductor die, precisely where a thick covering is desired. The reason why a thick polymer coating is desirable at the die edges is that bond pad metallization is typically placed near the die edges. Corrosion of the die typically starts at the edges, near the corners, due to the thin polymer coating or lack of polymer coating at the edges.

FIG. 1 illustrates a typical cross section of a partially shown encapsulated TAB die 10 as known in the prior art. A semiconductor die 12 is coated with an encapsulant 14 through a region of the die 12 that does not have an overlying TAB lead. Encapsulant 14 shows marked thinning at the die edge region 16 due to surface tension effects. If the quantity of encapsulant applied to the active surface 18 of the semiconductor die 12 exceeds a critical volume, or if the corner 20 of the die 12 has a chipped or other high surface energy region, the encapsulant 14 is typically predisposed to overflow the corner 20, which results in depositing encapsulant 22 on the die edge 24 and encapsulant 26 on the inactive surface 28 of the die 12.

FIG. 2 illustrates an additional view of the encapsulated TAB die 10 of FIG. 1 through a different cross-sectional plane cutting through a TAB lead 30, with an inner-lead-bond 31 to a bump 32. The TAB lead 30 has a downset region 34 which bends the lead 30 away from the semiconductor die 12, allowing a portion 36 of the encapsulant to fill under the downset region 34 of the TAB lead 30. Due to flow constraints imposed by the proximity of the downset region 34 to the die 12, die face voids 38 can result near the active surface 18 of the die. These voids 38 act as reservoirs into which moisture can condense and lead to corrosion of die circuitry contacted by the water. Voids 38 can also weaken the adhesive attachment of the TAB lead 30 to the active surface 18 due to a reduction of material under the downset region 34 of the lead 30, and due to the stress concentration effect induced by the voids 38. Higher levels of stress are thus transferred to the metallurgical inner-lead-bond 31. A portion 40 of the encapsulant may also flow down the die edge 24. While this portion helps to seal the die edge 24 to prevent corrosion, this overflow is typically uncontrolled and may result in depositing encapsulant on the inactive surface 28 (as previously illustrated in FIG. 1) which is cosmetically unacceptable and reduces thermal dissipative capacity of the die.

In general, the current TAB encapsulation process is difficult to control due to the propensity of the polymeric material to flow onto undesired surfaces, such as die edges and backsides. Although some die edge coverage is sometimes desirable, uncontrolled and uneven die edge coverage is not generally accepted in industry. Furthermore, it is also very difficult to form an encapsulant coating which is uniform in thickness across the active surface of the die. Additionally, it is also difficult to form a coating which predictably and regularly achieves a coating thickness which exceeds the minimum required thickness.

Thus, it is desirable to provide a TAB semiconductor device having none of the aforementioned disadvantages in the polymeric coating and the attendant encapsulation process.

SUMMARY OF THE INVENTION

The invention provides in one embodiment a semiconductor die having an active surface and a plurality of peripheral sidewalls, a housing protecting the plurality of peripheral sidewalls of the semiconductor die, a plurality of conductors TAB bonded to the active surface of the semiconductor die, and an encapsulant covering the active surface of the semiconductor die. The housing encircles the plurality of peripheral sidewalls of the semiconductor die, such that the active surface of the semiconductor die is fully exposed. A top edge of the housing extends above the active surface of the semiconductor die. The plurality of conductors can be either downset or non-downset, wherein the housing provides a standoff for the plurality of conductors. The encapsulant adheres to the active surface of the semiconductor die and covers a portion of the plurality of conductors, wherein the top edge of the housing acts as a dam to prevent the encapsulant from flowing beyond the housing. The invention also provides a method for making this embodiment.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

BRIEF DESCRIPTION OF THE DRAWINGS

FIGS. 1–2 illustrate, in cross-section, a partial TAB semiconductor device with the standard encapsulation as known in the prior art.

FIG. 3 illustrates, in cross-section, a TAB semiconductor device having adhesive bonded tape around the die edge in a first embodiment of the invention.

FIGS. 4, 5, 6 and 7 illustrate, in cross-section, process steps for making a TAB semiconductor device having a shrinkable die containment ring in accordance with another embodiment of the invention.

DETAILED DESCRIPTION OF A PREFERRED EMBODIMENT

Figure 7:
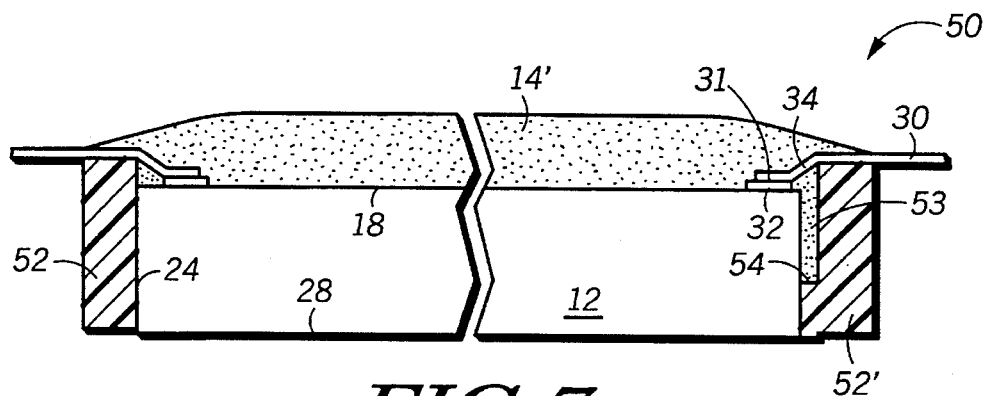

The invention is now discussed in detail with reference to the drawings. FIG. 3 illustrates, in cross-section, a TAB semiconductor device 42 having an adhesive bonded tape 44 around the edge 24 of the semiconductor die 12 in a first embodiment of the invention. The die 12 is typically sawn from a silicon wafer having multiple semiconductor dice. Test circuits are typically present in the saw street, and in many instances these test circuits are electrically connected to circuits on the individual die 12. The action of sawing cuts through the connection from the test circuits to the die, leaving the cross sections of the interconnect material exposed on the die edges 24.

After sawing, the leads 30 are bonded to bumps 32 using thermocompression, thermosonic, or other methods of inner-lead-bonding which are well known by those skilled in the art. It is also possible, but not illustrated, to bond leads directly to bonding pads on the active surface of a die. During or after the formation of the inner-lead-bonds 31, the leads 30 may be bent to form the downset region 34 to help prevent the leads 30 from contacting the active surface 18 of the semiconductor die 12. Downsetting is preferred in cases where the inner-lead-bonds are formed directly with the bonding pads, or when the bumps are low. The adhesive tape 44 comprises a polymer film coated with an adhesive on one surface. The process of applying the tape 44 involves peeling the tape from a continuous supply roll. Then the adhesive coated surface of the tape 44 is pressed against the die edge 24 through the use of a roller, or other appropriate means, forming an adhesive bond between the die edge 24 and the tape 44. The tape 44 is dispensed and bonded around the perimeter of the semiconductor die 12 by rotating the tape 44 about the die 12, or by rotating the die 12 within the dispense field. The adhesive bonded tape 44 is then cut, leaving the tape ends abutting, or slightly overlapping. The top edge of the tape 44 is positioned proximate to the underside of leads 30. Alternatively, the tape 44 is bonded to the die 12 before the leads 30 are bonded to the bumps 32.

As further illustrated in FIG. 3, the encapsulant material 14' is then dispensed into the pocket bounded by the top edge of the tape 44, which extends above the active surface 18 of the die 12 by approximately 5 to 100 micrometers (μm). These heights in no way limit the application of this invention since it is anticipated that other heights may be possible. The top edge of the tape 44 acts as a dam to prevent encapsulant overflow down the die edges or onto the die's inactive surface. Because of the dam, an encapsulant having relatively low viscosity can be used to get uniform coverage above and underneath the leads and inner-lead-bonds. The encapsulant 14' is then cured using heat, radiation, or other appropriate methods. The resultant encapsulation adhesively bonds the top edge of the tape 44 to the lead.

The tape 44, comprising the polymer film and adhesive materials, must be compatible with the processing temperatures used in the formation of the inner-lead-bonds 31 (if applied prior to the step of inner-lead-bonding) and encapsulant 14' curing environment. These temperatures are typically between 300° C. to 600 ° C. and 125° C. to 200° C., respectively. Both the polymer film and the adhesive used for the tape 44 should be of high purity and have a very low probability of producing chemical species which can cause integrated circuit (IC) corrosion during encapsulant cure or during the operating life of the device. The polymer film component of the tape 44 could be formed from high and low temperature polymers, such as polyimide and polyester, respectively, depending upon the bonding and encapsulation process and environment. Similarly, high and low temperature adhesives, such as polysiloxane or epoxy, respectively, can be used for the adhesive component of the tape 44. Thermoplastics, thermosets, and contact adhesives can also be used, if the adhesive purity and temperature stability is sufficient.

In addition to the purity and high temperature stability considerations in choosing an appropriate material for the polymer film and adhesive components of the tape 44, the resulting tape must be sufficiently flexible to bend around the 90° corners of the die 12, while providing some level of structural support to the leads 30. Depending upon the desired mechanical properties of the tape 44, the polymer film thickness can be expected to range from 10 μm to 125 μm, while the adhesive thickness can be expected to range from 3 μm to 100 μm, yielding an overall tape thickness ranging from 13 μm to 225 μm. The polymer film and adhesive thicknesses are not limited to the range of numbers specified since it is anticipated that other thicknesses may be possible.

The tape 44 provides a physical barrier to moisture and corrosion-inducing chemical species which may be present in the operating environment of the device. Furthermore, the tape 44 mechanically supports the die edges 24 to reduce the risk of die chipping and cracking. Penetration of the adhesive into sawing induced microcracks, invariably present at the die edges 24, may also aid in the reduction of stress concentration present at the tips of these microcracks, thus reducing the likelihood of die cracking due to microcrack crack front propagation. Therefore, the presence of the tape 44 around the die edges 24 increases the reliability of die 12 in the TAB device.

FIGS. 4–7 illustrate, in cross-section, process steps for forming a TAB semiconductor device 50 in accordance with another embodiment of the present invention. FIG. 4 illustrates a cross-section of a preformed containment ring 52 which can be made either by molding or by cutting cross-sectional segments from a length of extruded tubing having a round or non-round cross section. The materials used for the preformed ring should permit its shrinking via heat or radiation at the proper wavelength. In addition, the materials must be sufficiently compliant to conform to the die's ninety degree corners without fatiguing. Suitable shrinkable materials are available from Raychem Corp. and E. I. Dupont de Nemours, Inc., among others. Commercially available shrinkable polymers include polyolefins, poly vinylidene fluoride, and other fluoropolymers. Polyolefins, such as Raychem's RNF-100™ material, and poly vinylidene fluoride materials, such as Raychem's KYNAR™ (RT-850™), are readily formed into tubing or molded elements. The properties of RNF-100™ and KYNAR™ are incorporated by reference. Expanded fluoropolymers can be made to exhibit the desirable shrinkage characteristics. KYNAR™ can be used continuously at temperatures as high as 175° C., demonstrating compatibility with a typical encapsulant cure schedule of 3 hours at 150° C. Polyolefin RNF-100™ requires a lower maximum continuous operation temperature of 135° C., potentially limiting the range of compatible encapsulant materials to those which will cure at 135° C. or less.

FIG. 5 illustrates, in cross section, the next process step wherein the containment ring 52 is placed around an unbonded semiconductor die 12 such that the die is fully contained within the ring. The ring 52 is then heated or irradiated at the appropriate settings for the given material, resulting in the ring 52 compressing against the die edges 24 as illustrated in FIG. 6. The heat or radiation treated ring is held in place by friction and is not adhesively bonded to the edges of the die. Nevertheless, the action of shrinking the ring against the die edges seals the edges and enhances reliability as discussed above. The material shrink rate must be uniform so as not to cause an uneven stress during shrinking. Thermal and radiation shrinkable polymers are typically processed to stress the polymer molecules, resulting in a rigid structure. Subsequent thermal or radiation processing provides energy to the polymer molecular chains, permitting the molecules to relax to a lower stress state, causing the polymer to shrink about the die. The amount of shrinkage can be controlled by the polymer preprocessing, but shrinkage of up to 50 percent is not uncommon. The reduction of the height of the containment ring with thermal or radiative processing could be expected to range from 0 to 10 percent. Such shrinkage is accompanied by a thickening of the ring sidewall. If the ring is allowed to fully recover its pretreatment dimension through the shrink processing, the ring thickening will be maximized. If the ring is constrained from reaching full recovery, due to the collapse against the die edges, the ring thickening will be much less. The seal around the die edges 24 formed by the shrinkage of the ring 52 is mechanical in nature. The seal, and hence the die edge corrosion reliability, as discussed previously, can be enhanced by coating the inner wall of the shrinkable containment ring 52 with an optional thermoplastic, thermoset, or contact adhesive.

The following factors need to be considered when selecting a die containment ring size. The inside circumference of the containment ring must be at least minimally larger than the perimeter of the die in order for the ring to fit around the die prior to shrinkage. For example, if a ring with an inner diameter of 0.500 inch (12.7 mm), which will exhibit an inner diameter reduction of 50 percent to 0.250 inch (6.35 mm) with full recovery, is selected, the initial inner circumference of 1.5708 inch (39.9 mm) will reduce to 0.7854 inch (19.94 mm) after full shrinkage. A rectangular or square die with a perimeter of 1.570 inches (39.9 mm) would just fit inside the ring before shrinking. Such a die could measure 0.500 inch by 0.285 inch (12.7 mm by 7.24 mm). A die of this size would permit virtually no ring shrinkage with thermal or radiative processing. The containment ring would collapse, as a consequence of the thermal or radiative processing, against the edges of the die to apply a substantially normal force to the die edges, but virtually no ring dimension change would occur. If a rectangular die measuring 0.250 inch by 0.1425 inch (12.7 mm by 3.62 mm), with a perimeter measuring 0.785 inch (19.94 mm), were placed inside the ring, subsequent full shrinkage recovery would result in the ring forming about the die with no normal force applied to the die edge. Lacking a substantially normal force against the die edges, no edge seal would be formed, thus defeating the effectiveness of the die containment ring. Therefore, a die with a perimeter substantially greater than 0.785 inch (19.94 mm) and substantially less than 1.5708 inch (39.9 mm) would be suitable for use with a shrinkable ring possessing an internal diameter of 0.500 inch before a shrinkage process which would cause a maximum unrestrained radial shrinkage of 50%.

It is apparent then that the size of the shrinkable containment ring must be carefully selected to accommodate the selected die, or range of die sizes. Therefore, the level of normal force applied to the die edge after shrinkage will be a function of the die size relative to the inner dimension of the ring and the recovered material's elastic modulus and thermal expansion coefficient. Since the shrinkable material is subject to a small height shrinkage of 0 to 10 percent, the pre-shrink ring height is not a critical dimension. A preferred embodiment would pair a semiconductor die with a containment ring having dimensions allowing from 10 to 40 percent reduction of the ring inner diameter after thermal or radiative processing although it is anticipated that shrinkage ranges beyond the specified limits could also be appropriate.

After the step of shrinking, the edge protected die undergoes the normal TAB assembly process, such as inner-lead-bonding, downsetting and encapsulation. Alternatively, inner-lead-bonding can be performed prior to the attachment of the containment ring. Bonding the TAB leads to the semiconductor die first is preferable in many instances where the material of the containment ring cannot withstand the high inner-lead-bonding temperature. It is possible that downsetting may be performed concurrently with inner-lead-bonding if the height of the containment ring 52 is sufficient to provide a standoff for the leads 30. FIG. 7 illustrates a split cross-section depicting alternative shrinkable containment ring configurations. The left half of FIG. 7 illustrates a ring 52 having a straight inner sidewall, while the right half illustrates a ring 52' having a stepped inner sidewall. In either configuration, a portion of the containment ring sidewall contacts the die sidewall with a normal force due to the shrinkage of the ring with thermal or radiation treatment.

The encapsulant material 14' is dispensed into the region bounded by the top edge of the containment ring 52/52'. The top edge should extend above the die's active surface 18 by approximately 0 to 100 μm. This range is only illustrative of a preferred embodiment and is in no way limiting since it is anticipated that other heights may be possible. The encapsulant flows across the active surface 18 to form a protective covering. The top edge of the ring acts as a dam to prevent encapsulant overflow. As illustrated in the right half of FIG. 7, the encapsulant also flows into the gap 53 between the die and ring when the inner sidewall is stepped. This gap filling by the encapsulant is largely due to surface tension effects. An advantage to having this gap 53 filled with the encapsulant is that the die edge is effectively sealed with the encapsulant. The encapsulant flow down the die edge is limited to the top of the step 54 so the result is controlled in practicing this embodiment.

An adhesive may optionally be pre-applied to the inner sidewall of the ring 52 or the inner sidewall of the step 54 of the ring 52'. After shrinkage, the adhesive is compressed against die edge 24. The adhesive bonding process can be completed during the thermal ring shrinkage process or during encapsulant cure. Otherwise, the adhesive can bond to die edge 24 in a separate operation if needed. The encapsulant 14' is then cured using heat, radiation, or other means, bonding the ring edge to the lead. Suitable materials for the encapsulant 14' are those having relatively low viscosities so that the material flows easily to provide good and uniform coverage. Overflow is not a problem due to the presence of the containment ring. The selected die encapsulant material would have to exhibit good adhesion to the containment ring. Since polyolefins and fluoropolymers have low surface energies, they are not readily wetted or bound by some adhesives or encapsulant materials, so the proper epoxy, silicone, or fluoropolymer based encapsulant would have to be selected.

When the containment ring is applied prior to the inner-lead-bonding step, the material for the containment ring must be compatible with the inner-lead-bond processing temperatures which typically range from 300° C. to 600° C. However, one should also consider that the ring would not be exposed to this high temperature for any extended period of time, so the effects of the transient high temperature may not be so detrimental to the ring. Nevertheless, it is recommended that a high temperature material be selected for the containment ring if it is to be applied to the die prior to the inner-lead-bonding step. Lower temperature materials are suitable if the ring is to be applied post inner-lead-bonding. The containment ring must also be thermally compatible with the encapsulant curing temperature, which typically ranges from 125° to 200° C. The materials used for the ring should be of high purity (for electronic applications) such that the ring material does not produce chemical species which can cause IC corrosion during the encapsulant cure or during the operating life of the device. Depending upon the mechanical properties of the selected ring material, the ring thickness can be expected to range from 125 μm to 1000 μm. However, the ring thickness is in no way limited to this range as other thicknesses may also be suitable in practicing the invention.

The advantages of having the containment ring around the semiconductor die are similar to that of the adhesively bonded tape. The containment ring provides a die edge barrier to moisture and corrosion-inducing chemical species which may be present in the application environment. Furthermore, the containment ring mechanical supports to the die reduce the risk of die chipping and cracking. Since the ring is more rigid than the tape, this embodiment provides greater mechanical support for the semiconductor die. The stepped inner sidewall of the containment ring allows penetration of the encapsulant into die edge fissures and microcracks, to reduce the risk of crack propagation, thereby increasing the reliability of device. The optionally added adhesive on the ring's inner sidewalls provide an additional protection mechanism. In either configurations of the containment ring, the encapsulant flow is automatically contained so that no uncontrolled overflow down the die edges or to the die inactive surface occurs.

Figure 8:
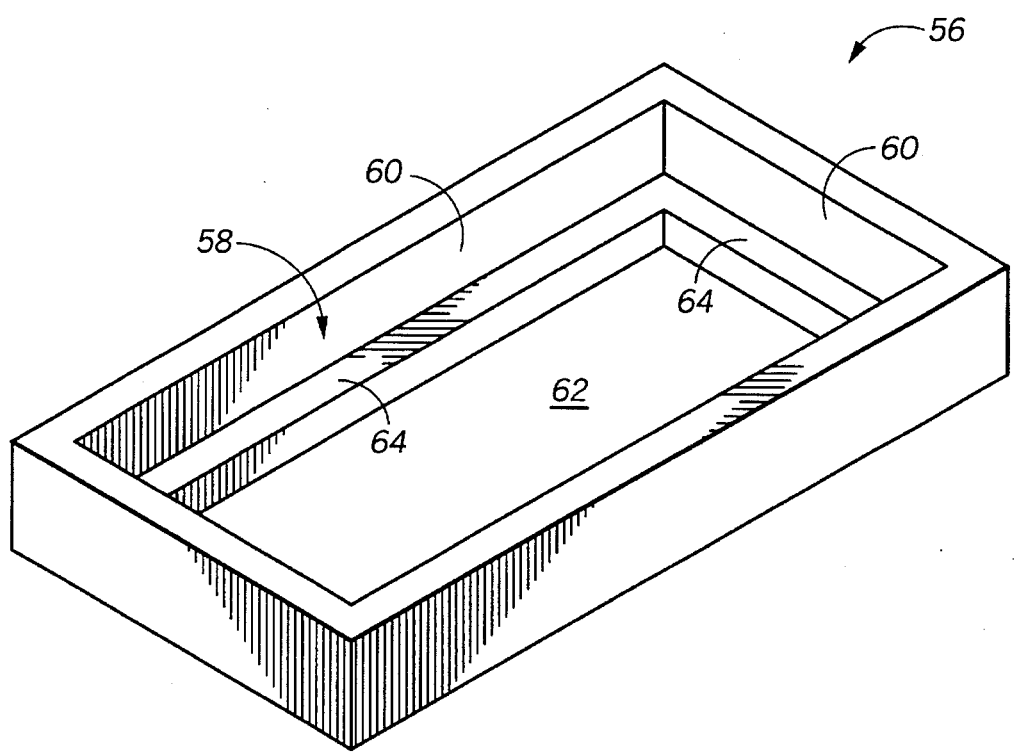
FIG. 8 illustrates, in an isometric view, a die containment pocket for use in making a TAB semiconductor device in accordance with an embodiment of the invention.

In yet another embodiment of the present invention, a preformed die containment pocket 56, as illustrated in FIG. 8, may be used in conjunction with a TAB semiconductor device to provide die edge protection. Containment pocket 56 may be made from a heat or radiation shrinkable polymer, or from a heat and radiation stable polymer. The non-shrinking materials may be a conventional thermoplastic, such as polyethersulfone or polyetherimide; a thermoset epoxy molding compound; an advanced thermoplastic, such as Celazole™, a polybenzimidazole made by Hoechst Celanese Corp.; an advanced liquid crystal polymer; or a sintered high performance plastic, such as Isaryl™, a polyarylate made by Isonova Technische Innovationen Ges.m.b.H. The properties of Celazole™ and Isaryl™ are incorporated by reference. Shrinkable materials may be selected from the list of suitable materials for the containment ring 52 of FIGS. 4–7.

The thickness of the die containment pocket 56 cross-sectional elements are in a range of 100 μm to 2000 μm, with the lower end of the range (100 μm to 500 μm) being preferred due to the typical limits imposed by cost effective polymer molding practice. Ideally the wall thickness would be minimized to allow the smallest die assembly size and mass, while still providing mechanical support to the die, and the TAB leads, if so designed. Containment pocket 56 is designed to have a TAB bonded die inserted into the shallow cavity 58 where it will be contained within cavity sidewalls 60. The floor of cavity 58 may be solid (not shown), or it may have an opening 62 formed therein to permit heat sinking directly to the die's inactive surface. The depth of the cavity can be designed to permit the backside of a TAB bonded die to be supported by the top surface of the ledge 64. Cavity depth can also be designed to permit the top surface of the cavity sidewalls 60 to contact the underside of the TAB leads. The ledge 64 supports the perimeter of the die, while the sidewalls 60 protect the edges of the die from handling and other forms of mechanical abuse.

Figure 9:
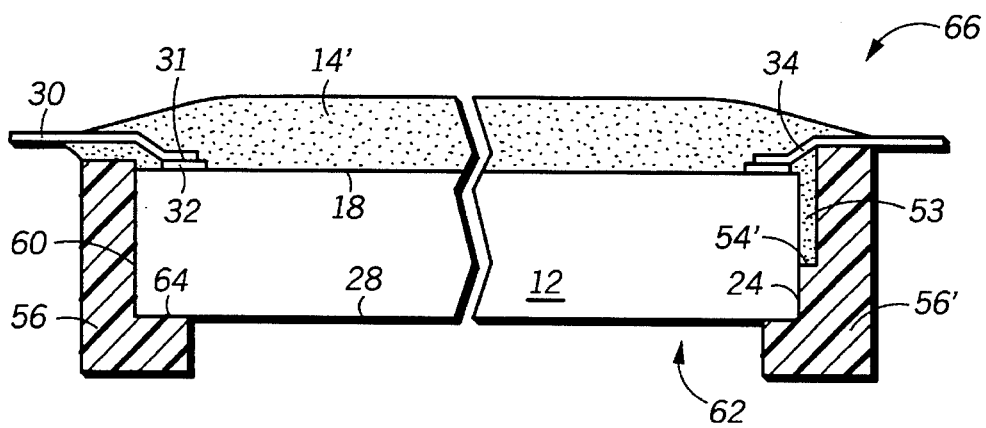
FIG. 9 illustrates, in cross-section, a TAB semiconductor device having a shrinkable die containment pocket in accordance with the invention.

FIG. 9 illustrates a split cross-section of a semiconductor device 66 having the semiconductor die 12 supported by the molded shrinkable containment pocket, depicting alternative die containment pocket configurations. The left half of FIG. 9 illustrates the containment pocket 56 having a straight inner sidewall, while the right half illustrates containment pocket 56' having a stepped inner sidewall. The semiconductor die 12 is placed inside the cavity of the die containment pocket 56/56'. The containment pocket is then shrunk around the die either through heating or irradiation, depending on the containment pocket material. While it is recommended that the shrinkable containment pocket be applied after inner-lead-bonding, it is also possible to apply the shrinkable ring prior to lead bonding provided that the containment pocket material is thermally compatible with the inner-lead-bonding temperatures. After the containment pocket shrinking process, the edge protected die undergoes the remaining TAB assembly process steps.

Use of the die containment pocket affords many advantages to the assembly of a TAB semiconductor device. The compression of containment pocket 56/56' against the edges 24 of the semiconductor die 12 forms a mechanical seal against the die edges. Furthermore, the die containment pocket provides mechanical support to the semiconductor die to reduce the risk of die chipping and cracking. Additionally, the second configuration 56' allows compression against a lower portion of the die edge 24 while forming a gap between a remaining portion of the die edge and the inner sidewall of the containment pocket. The gap is filled with the TAB encapsulant 14' to structurally bond the semiconductor die to the containment pocket. This bond permits highly reliable edge seal. Due to the presence of the containment pocket sidewalls, the encapsulant flow is controlled, and the possibility of the encapsulant flowing to the inactive surface of the semiconductor die is eliminated.

Figure 10:
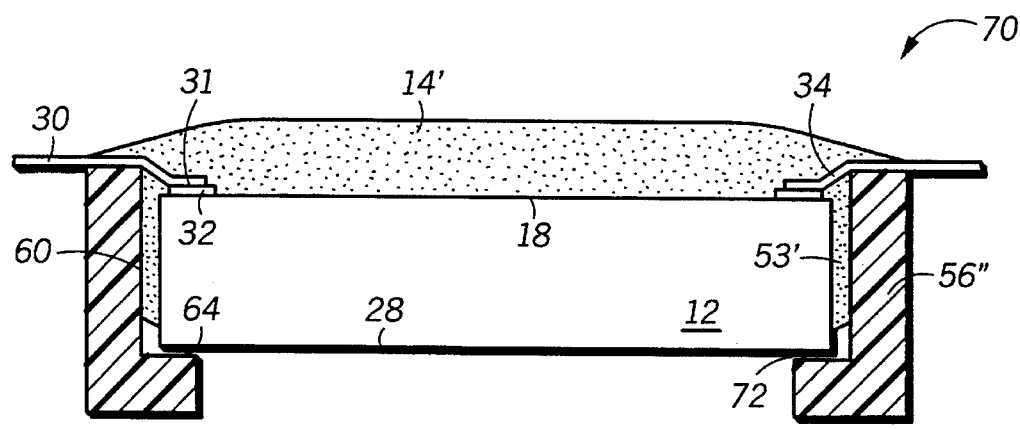
FIG. 10 illustrates, in cross-section, a TAB semiconductor device having a non-shrinkable die containment pocket in yet another embodiment of the invention.

FIG. 10 illustrates a cross-section of a TAB semiconductor device 70 in yet another embodiment of the present invention. In this embodiment, the die containment pocket 56" is made from a nonshrinkable material. The height of containment pocket sidewalls 60 can be designed to allow the underside of the leads 30 to contact the top of the sidewalls 60, leaving a small gap 72 between the die's inactive surface 28 and the top of the cavity ledge 64. Alternatively, the height of the containment pocket sidewalls 60 can be designed to allow the die's inactive surface to rest upon the surface of cavity ledge 64, leaving a small gap (not shown) between the underside of the leads 30 and the top of cavity sidewalls 60. The encapsulant 14' is dispensed onto the die's active surface 18 to form a protective covering. A portion of the encapsulant fills the gap 53' between the die edges 24 and the inner sidewall of the containment pocket. The encapsulant in this gap helps to structurally bond the die 12 to the die containment pocket 56". This bond also effectively seals the die edges. The encapsulant flow down the side of the die to fill the gap 53' is controlled by the rheology of the encapsulant 14' and the width of the gap.

Figure 11:
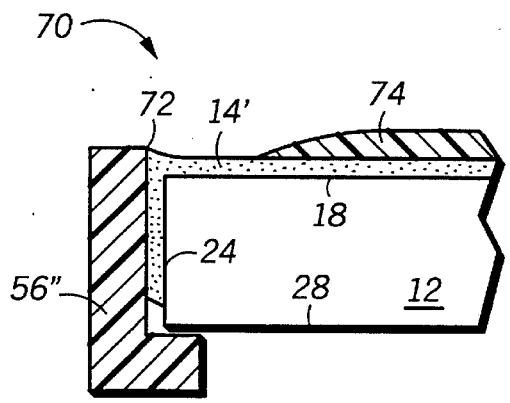
FIGS. 11–12 illustrate, in cross-section, a partial TAB semiconductor device having an improved encapsulant meniscus control in accordance with the invention.
Figure 12:
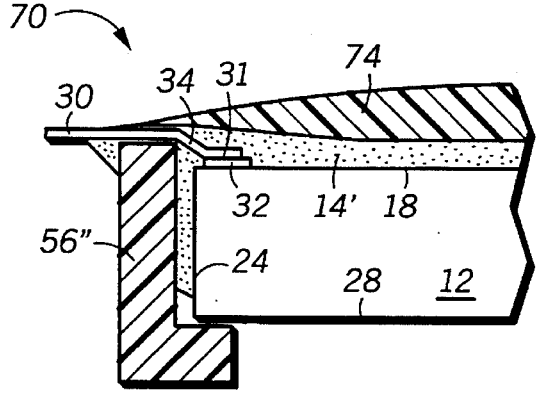

FIGS. 11 and 12 illustrate partial cross-sections of the device 70 of FIG. 10 to show expected encapsulant thickness contours. These contours can also occur in any of the embodiments of this invention. FIG. 11 depicts a view taken through a cross-sectional plane in a region between the TAB leads, while FIG. 12 depicts a view taken along a different cross-sectional plane that cuts through a TAB lead. The lower layer of encapsulant 14' that is illustrated to be in direct contact with the active surface 18 of the die 12 exemplifies a coating meniscus that typically forms with a relatively small amount of applied encapsulant, on the order of less than 40 mg. In this case, the thickest encapsulant coating occurs at the top edge 72 of the die containment pocket sidewall or over the topside of the TAB leads 30 where they cross over the die containment pocket sidewall. The upper encapsulant layer 74 exemplifies a convex coating meniscus that typically forms when a larger amount, on the order of greater than 50 mg, of encapsulant is applied. The encapsulant tends to pool in the central area of the die forming the greatest encapsulant thickness in this area. It must be understood that encapsulant layers 14' and 74 do not imply the application of two individual coating layers, but only indicate different coating contours which can be expected when a relatively small or relatively large amount of an encapsulant is applied respectively.

Figure 13:
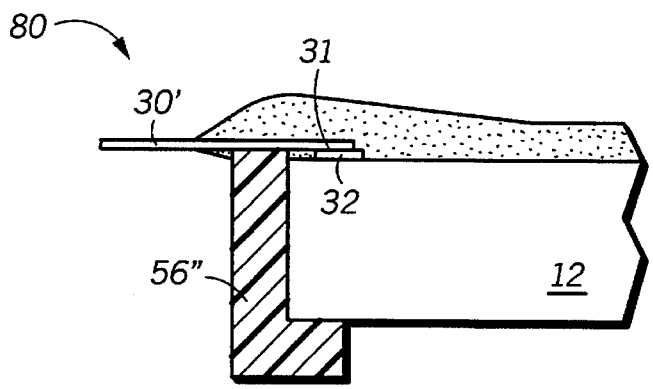
FIG. 13 illustrates, in cross-section, a non-downset TAB semiconductor device having a die containment pocket in another embodiment of the invention.

FIG. 13 illustrates a partial cross-section of TAB semiconductor device 80 in another embodiment of the invention. In this illustration, the TAB lead is not downset but rather maintained in a flat shape from the inner-lead bond 31 extending beyond the containment pocket. Downsetting may be eliminated in certain TAB devices where bump 32 is of sufficient height that no shorting of the TAB lead to the active surface of the die would occur. The non-downset configuration of the TAB leads may be used with any of the other embodiments of this invention.

The foregoing description and illustrations contained herein demonstrate many of the advantages associated with the present invention. In particular, it has been revealed that a TAB semiconductor device having die edge protection is possible with various shrinkable and nonshrinkable containment mechanisms. The various containment schemes provide both die edge protection as well as a restraint on encapsulant flow to enable more uniform coverage on the active surface of the semiconductor die. Moreover, the containment mechanisms help to support the semiconductor die to reduce die cracking and chipping. Yet another advantage is that practicing the present invention eliminates uneven and uncontrolled encapsulant overflow down the die edges and the die's inactive surface.

Thus it is apparent that there has been provided, in accordance with the invention, a TAB semiconductor device having die edge protection and a method for making the same that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the die containment pocket may be made from a material other than a polymer. In addition, the invention is not limited to any particular thickness of containment mechanisms. Therefore, it is intended that this invention encompass all such variations and modifications falling within the scope of the appended claims.

We claim:

1. A semiconductor device comprising:

a semiconductor die having an active surface, an inactive surface, and a plurality of peripheral sidewalls;

an integral polymeric die containment pocket having a polymeric bottom surface and a plurality of sidewalls, wherein the semiconductor die is disposed upon said polymeric bottom surface such that the plurality of sidewalls of the containment pocket encircles the plurality of peripheral sidewalls such that the active surface is fully exposed and the inactive surface is partially covered, wherein a top edge of the containment pocket extends above the active surface of the semiconductor die;

a plurality of conductors extending over and TAB bonded to the active surface of the semiconductor die, wherein the top edge of the containment pocket provides a standoff for the plurality of conductors such that the plurality of conductors bends from a higher plane as defined by the top edge to a lower plane as defined by the active surface of the semiconductor die; and an encapsulant adhering to the active surface of the semiconductor die and covering a portion of the plurality of conductors, wherein the top edge of the containment pocket acts as a dam to prevent the encapsulant from flowing beyond the containment pocket.

2. The device of claim 1, wherein the die containment pocket has a sidewall thickness substantially in a range of 100 to 2000 microns.

3. The device of claim 1, wherein the die containment pocket has a stepped inner sidewall that intimately contacts a first portion of the plurality of peripheral sidewalls of the semiconductor die, leaving a gap between the die containment pocket and a second portion of the plurality of peripheral sidewalls, such that the encapsulant occupies a portion of the gap to adhesively bond the semiconductor die to the die containment pocket.

4. The device of claim 1, wherein the polymeric die containment pocket is selected from a group of materials consisting of: polyolefin, poly vinylidene fluoride, fluoropolymer, thermoplastic polymer, polyethersulfone, polyetherimide, thermoset polymer, epoxy, polybenzimidazole, liquid crystal polymer, sintered plastic, and polyarylate.

5. A semiconductor device comprising:

a semiconductor die having an active surface, an inactive surface, and a plurality of peripheral sidewalls;

a polymer tape in contact with and intimately adhesively bonded to the plurality of peripheral sidewalls, such that the active surface is fully exposed, wherein a top edge of the polymer tape extends above the active surface of the semiconductor die;

a plurality of conductors extending over and TAB bonded to the active surface of the semiconductor die; and an encapsulant adhering to the active surface of the semiconductor die and covering a portion of the plurality of conductors, wherein the top edge of the polymer tape acts as a dam to prevent the encapsulant from flowing laterally beyond the polymer tape and wherein the encapsulant is confined to a spread approximately equal to a surface area of the semiconductor die.

6. The device of claim 5, wherein the polymer tape is selected from a group of materials consisting of: polyimide tape and polyester tape.

7. The device of claim 5, wherein the top edge of the tape extends above the active surface of the semiconductor die by approximately 5 to 100 microns.

8. A semiconductor device comprising:

a semiconductor die having an active surface, an inactive surface, and a plurality of peripheral sidewalls;

a shrinkable containment ring for containing and protecting the semiconductor die, wherein a portion of said containment ring is in intimate contact with, and exerts a normal force against the plurality of peripheral sidewalls, such that the active surface is fully exposed and the inactive surface is at most partially covered, and wherein a top edge of said containment ring extends above the active surface of the semiconductor die;

a plurality of conductors extending over and TAB bonded to the active surface of the semiconductor die, wherein said containment ring provides a standoff for the plurality of conductors; and an encapsulate adhering to the active surface of the semiconductor die and covering a portion of the plurality of conductors, wherein the top edge of said containment ring acts as a dam to prevent the encapsulant from flowing laterally beyond said containment ring.

9. The device of claim 8, wherein said shrinkable containment ring has a stepped inner sidewall that intimately contacts a first portion of the plurality of peripheral sidewalls of the semiconductor die, leaving a gap between said containment ring and a second portion of the plurality of peripheral sidewalls, such that the encapsulant occupies a portion of the gap to adhesively bond the semiconductor die to said containment ring.

10. The device of claim 8, wherein said shrinkable containment ring has an adhesive material on an inner sidewall, wherein the plurality of peripheral sidewalls of the semiconductor die is adhesively bonded by the adhesive material to the shrinkable containment ring.

11. The device of claim 10, wherein said shrinkable containment ring is selected from a group of materials consisting of: polyolefin, poly vinylidene fluoride, and fluoropolymer.

* * * * *